United States Patent [19]
Li

[11] Patent Number: 6,160,709
[45] Date of Patent: Dec. 12, 2000

[54] RETENTION DEVICE FOR MOUNTING HEAT SINK TO CPU SOCKET

[75] Inventor: Yu-Sung Li, Yung-Ho, Taiwan

[73] Assignee: Hon Hai Precision Ind. CO, Ltd., Taipei Hsien, Taiwan

[21] Appl. No.: 09/469,413

[22] Filed: Dec. 22, 1999

[30] Foreign Application Priority Data

Dec. 22, 1998 [TW] Taiwan ................................ 87221337

[51] Int. Cl.$^7$ ...................................................... H05G 7/20
[52] U.S. Cl. .......................... 361/704; 174/16.3; 257/719; 439/71; 439/331; 439/487
[58] Field of Search .................. 165/86.2, 185; 174/16.3; 257/718–719, 726–727; 361/704, 707, 709–710, 715, 785–786; 439/71, 72, 77, 79, 485, 487

[56] References Cited

U.S. PATENT DOCUMENTS

| | | | |
|---|---|---|---|
| 5,493,475 | 2/1996 | Lin | 361/710 |
| 5,602,719 | 2/1997 | Kinion | 361/704 |
| 5,669,784 | 9/1997 | Ito et al. | 439/331 |
| 5,777,825 | 7/1998 | Bell | 361/769 |

*Primary Examiner*—Gregory Thompson
*Attorney, Agent, or Firm*—Wei Te Chung

[57] ABSTRACT

A retention device for mounting a heat sink to a CPU socket comprises a pair of supporting members and a pair of pressing members. Each supporting member is pivotably assembled with one pressing member to form a subassembly. The subassemblies straddle opposite ends of the CPU socket, respectively. Each supporting member comprises a supporting portion defining a supporting face thereon and a pair of side portions. The side portions define a pair of through holes therethrough and a pair of side supporting face thereon. The supporting faces together with the side supporting faces support opposite sides of a heat sink having a pair of retention plates extending therefrom thereon. Each pressing member comprises an operating portion and a pressing portion defining an abutting portion to engage with a corresponding retention plate of the heat sink. Each pressing portion forms a pair of axles extending from two opposite outer surfaces thereof to engage with the through holes of the supporting member. The pressing members and the supporting members locate each other with latch mechanism on the pressing portions and the supporting faces thereof.

8 Claims, 6 Drawing Sheets

RETENTION DEVICE FOR MOUNTING HEAT SINK TO CPU SOCKET

BACKGROUND OF THE INVENTION

1. Field of the Invention

The present invention relates to a retention device for mounting a heat sink to a central processing unit (hereafter, CPU) socket, and particularly to a retention device which can facilitate a reliable and quick assembly and disassembly between a heat sink and a CPU socket.

2. Description of the Prior Art

Examples of related art are disclosed in Taiwan Patent Application Nos. 82212213, 84207163, and 84207861. Referring to FIGS. 7 and 8, a conventional retention device is in a shape of a frame 20. The frame 20 comprises a pair of opposite side walls 22, a pair of opposite retention walls 23 each defining an elongated slit 24 therein, and four supporting plates 21 extending horizontally inward from bottoms of the side walls 22 and the retention walls 23. In assembly, a CPU 10 is put into a center portion of the frame 20 and is supported by the four supporting plates 21 at four sides thereof. A heat sink 30 having a pair of retention portions 31 is superposed on the CPU 10 and retained thereon by being inserted into the frame 20 to reach a position in which elongated ribs 32 of the retention portions 31 engage with the elongated slits 24 of the retention walls 23 of the frame 20. The connection between the CPU 10 and a circuit board (not shown) is presently by means of BGA (Ball Grid Array), which results in smaller connection strength therebetween. When inserting the heat sink 30 into the frame 20, the insertion force may cause a damage to the connection. Meanwhile, disassembly of the frame 20 with the heat sink 30 is difficult and needs special tools, thereby complicating operation thereof.

An improved retention device is required to overcome the disadvantages of the prior art.

SUMMARY OF THE INVENTION

The main object of the present invention is to provide a retention device which can easily assemble and disassemble a heat sink with a CPU socket connector; and Another object of the present invention is to provide a retention device, the operation of which does not damage a CPU in the electrical socket.

A retention device in accordance with the present invention includes a pair of subassemblies straddling two opposite ends of the CPU socket and each comprising a supporting member and a pressing member.

The supporting members each comprises a supporting portion defining a supporting face for supporting one retention plates extending from one of opposite sides of the base of the heat sink and a pair of side portions defining side supporting faces for supporting the side of the heat sink except for where the retention plate extending from. Each side portion defines a through hole therethrough.

Each pressing member is assembled with a corresponding supporting member by a pair of axles formed thereon engaging with the through holes of the supporting member and comprises a pressing portion for retaining the heat sink above the CPU socket and an operating portion. The operating portions urge the pressing portions pivoting about the pair of axles to assemble or disassemble the retention device with the heat sink upon being effected by an external force exerted by a user.

Other objects, advantages and novel features of the invention will become more apparent from the following detailed description of the present embodiment when taken in conjunction with the accompanying drawings.

DETAILED DESCRIPTION OF THE INVENTION

Figure 1:
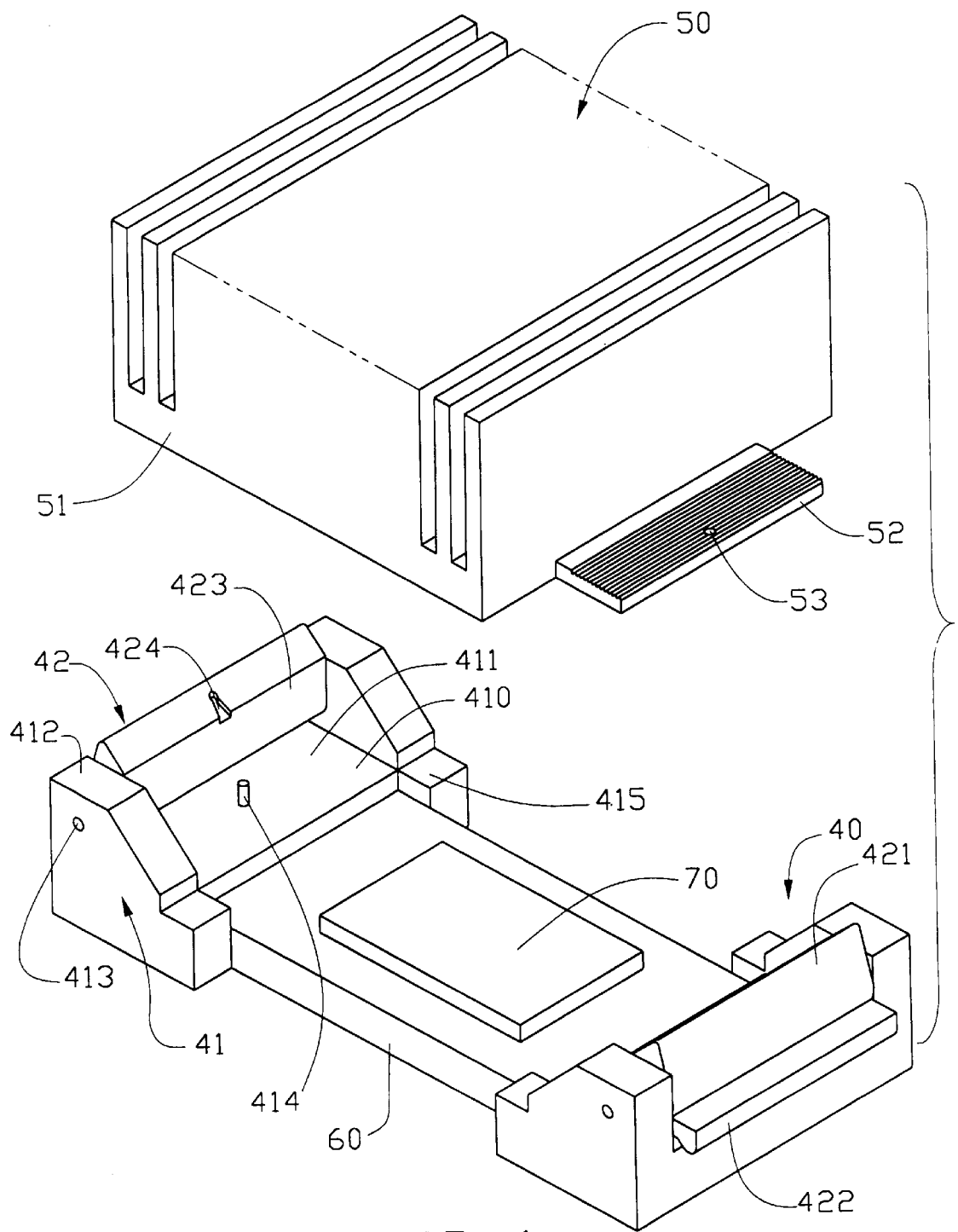
FIG. 1 is a perspective view of a retention device in accordance with the present invention with a CPU and a CPU socket assembled thereto, and a heat sink above.
Figure 2:
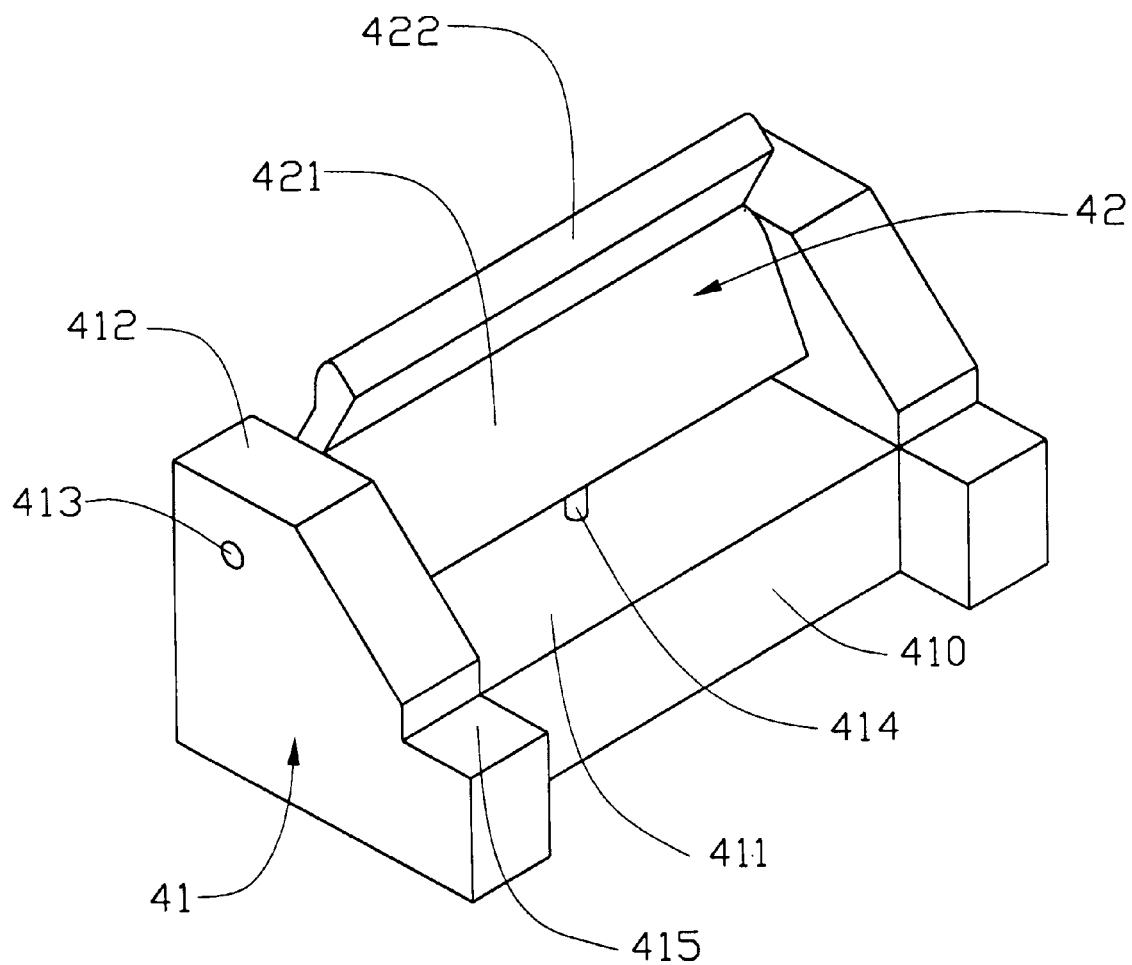
FIG. 2 is a perspective view of a subassembly of the retention device of FIG. 1.
Figure 3:
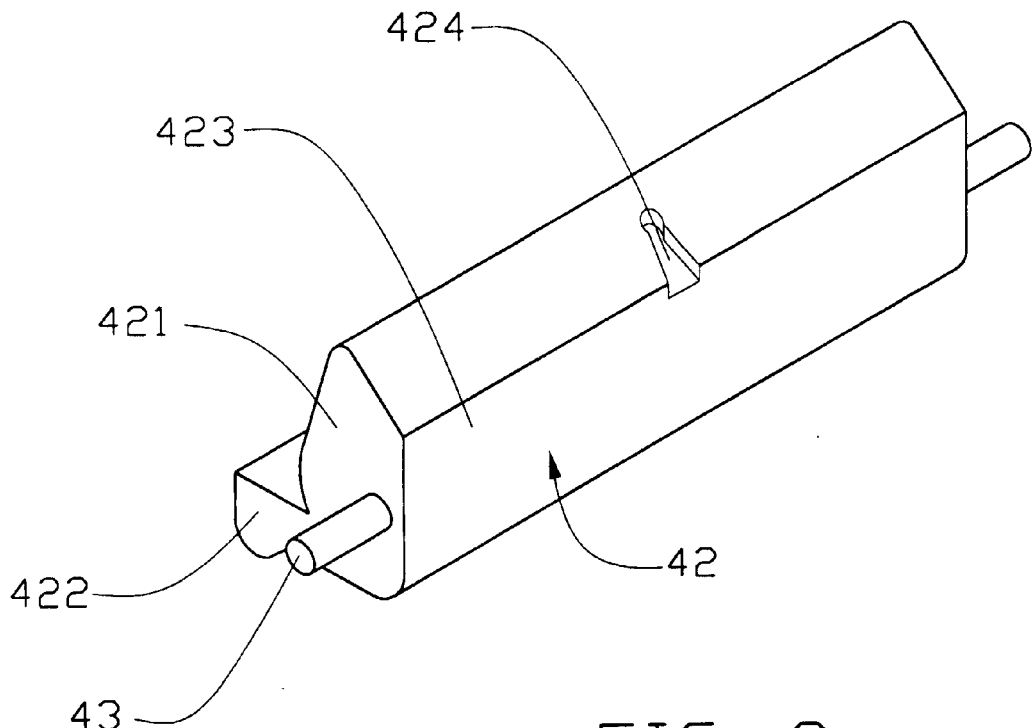
FIG. 3 is a perspective view of a pressing member of subassembly of FIG. 2 viewed from a different aspect.
Figure 4:
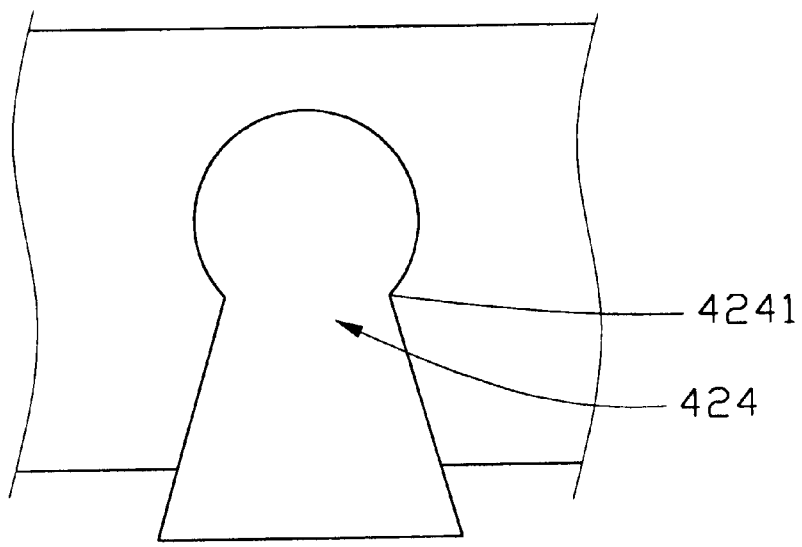
FIG. 4 is a partially enlarged view of FIG. 3.

Referring to FIG. 1, a retention device in accordance with the present invention for mounting a heat sink 50 to an electrical socket 60 with a CPU 70 thereon comprises a pair of subassemblies 40. Each subassembly 40 comprises a supporting member 41 and a pressing member 42 assembled with the supporting member 41. The subassemblies 40 are mirror images of each other.

Referring to FIGS. 2, 3, 4, and 6, the supporting members 41 each comprises a pair of opposite side portions 412 and a supporting portion 410 therebetween. Each side portion 412 is stepped and defines a through hole 413 extending through an upper step thereof and a side supporting face 415 on a lower step thereof. The supporting portion 410 defines a supporting face 411 coplanar with the side supporting faces 415. The supporting face 411 has a post 414 projecting vertically upward from an approximately center section thereof.

The pressing member 42 comprises a pressing portion 421, an operating portion 422, and a pair of axles 43 extending from opposite outer faces of the pressing portion 421. The axles 43 are rotatably received in the through holes 413, respectively so that the pressing member 42 is pivotable relative to the supporting members 41. The pressing portion 421 defines an abutting portion 423 adjacent one longitudinal face thereof; said longitudinal face defines a groove 424 in an approximately center section thereof. The groove 424 has a neck section 4241 in substantially a center section thereof.

Figure 5:
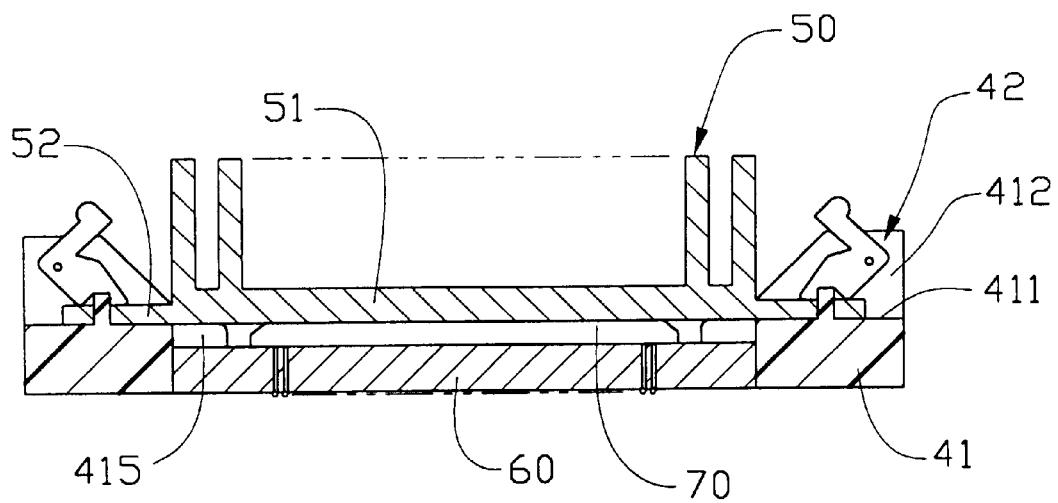
FIG. 5 is a cross sectional assembled view of FIG. 1.
Figure 6:
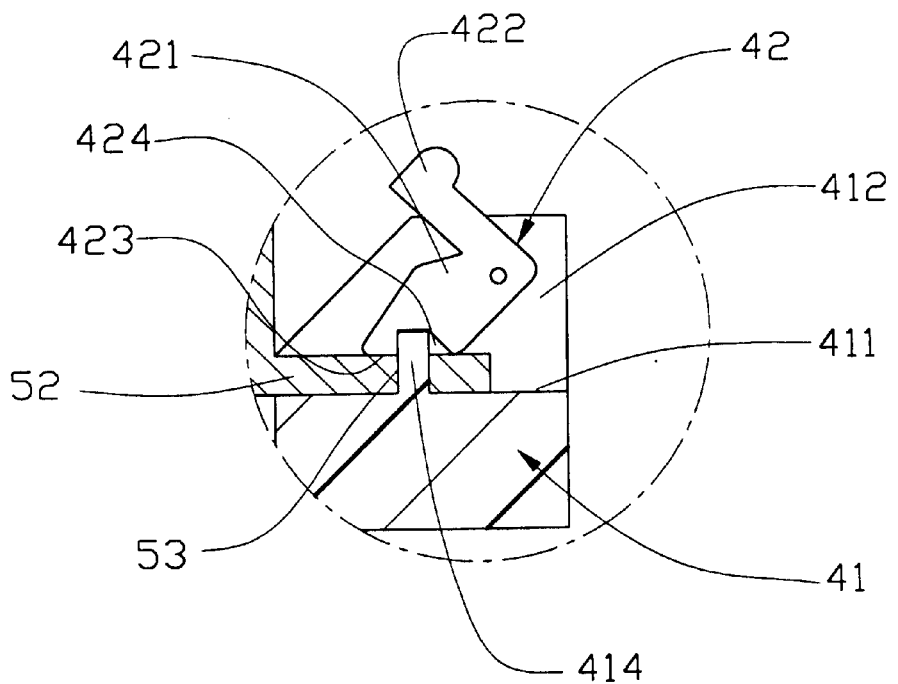
FIG. 6 is a partially enlarged view of FIG. 5.
Figure 7:
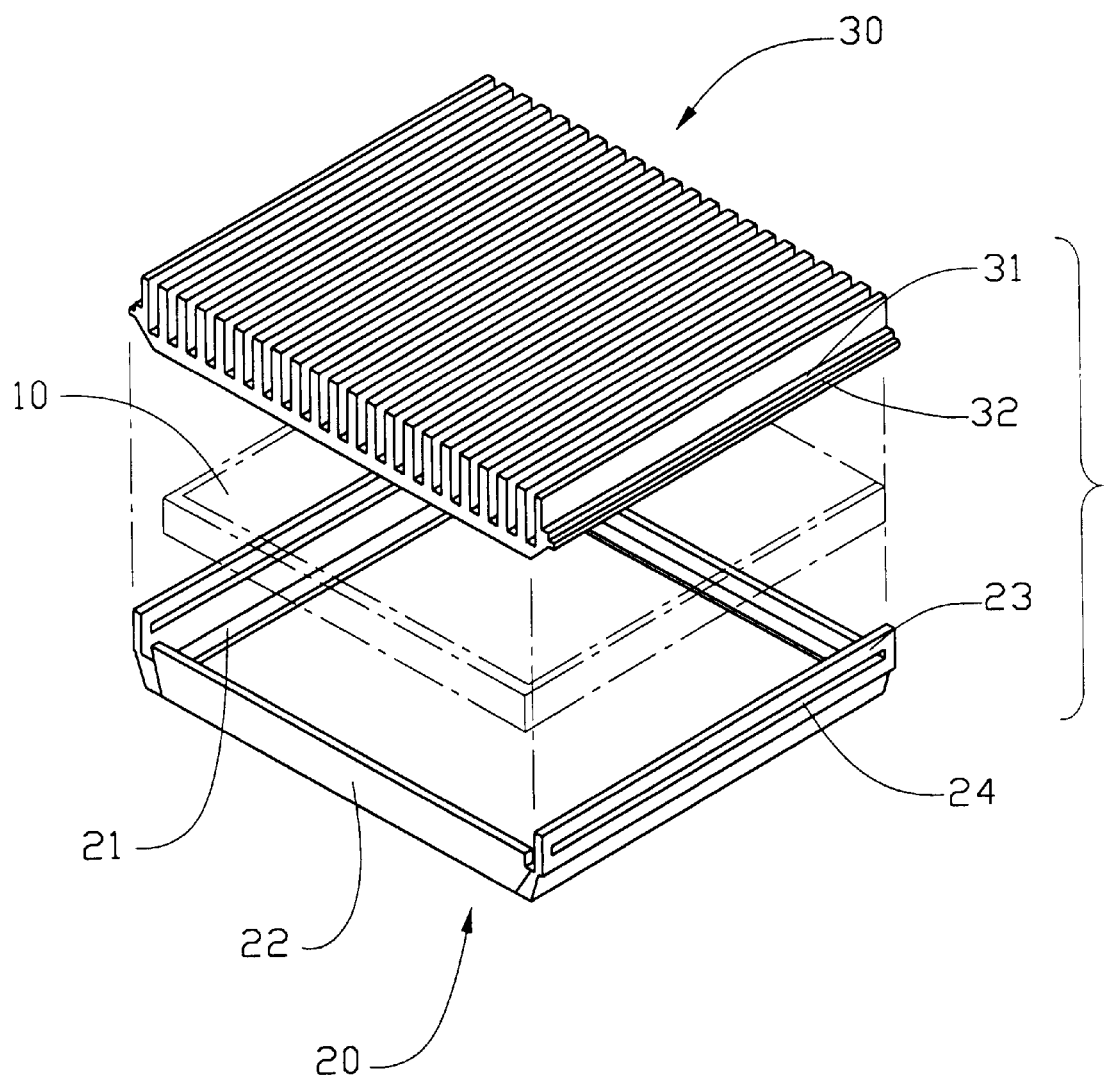
FIG. 7 is an exploded view of a conventional retention system including a conventional retention device, a heat sink and a CPU therein.
Figure 8:
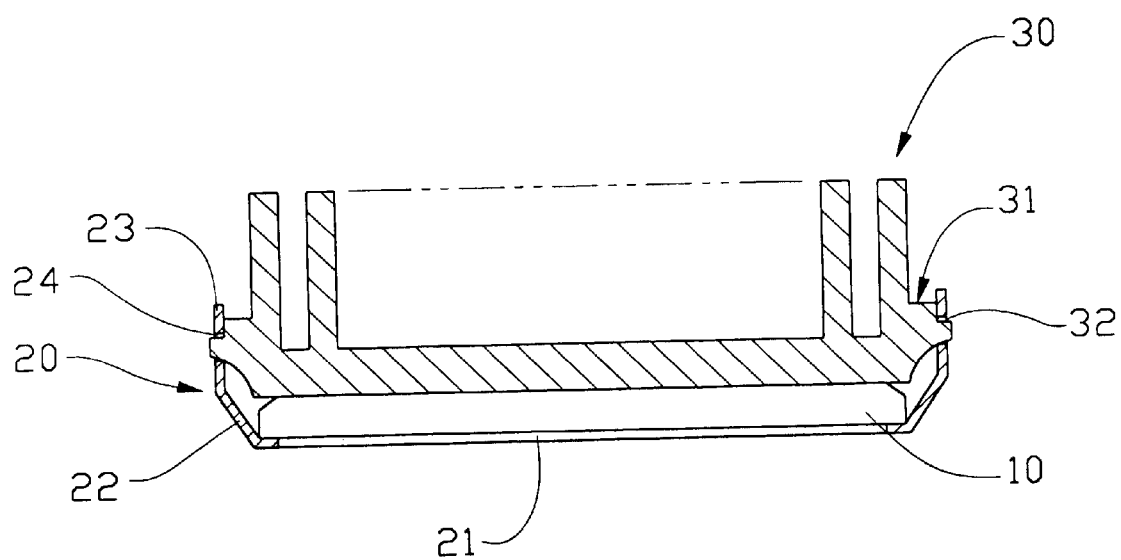
FIG. 8 is a cross sectional assembled view of FIG. 7.

Referring to FIG. 5, in assembly, the axles 43 engage with the through holes 413 to assemble the supporting member 41 with the pressing member 42, thereby forming the subassembly 40. The subassemblies 40 are assembled to the electrical socket 60 by straddling two opposite transverse sides of the electrical socket 60, respectively, by the lower steps of the supporting members 41 of the subassemblies 40, wherein the support portions 410 abut the opposite traverse sides of the electrical socket 60. The supporting face 411 is substantially flush with a top face of the CPU 70 on the electrical socket 60. When the heat sink 50 is mounted onto the CPU 70, two apertures 53 (FIG. 6) in a pair of retention plates 52 of the heat sink 50 engage with the posts 414 to correctly position the heat sink 50 on the CPU 70. The retention plates 52 are each extended from a middle of one of opposite sides of the heat sink 50. The retention plates 52 are supported by the supporting faces 411, and four corners of the heat sink 50 are supported by the side supporting faces 415. An external force exerted by a user on the operating portions 422 urges the pressing members 42 to rotate inwards. The abutting portions 423 abut against the retention plates 52 of the heat sink 50, the posts 414 enter into the grooves 424 thereby being retained by the neck section 4241 of the grooves 424, whereby the heat sink 50 is reliably retained in position. Herein the retention plates 52 may also be optionally roughened to increase retention force between the retention plates 52 and the abutting portions 423, if desired. In disassembly, a user exerts forces on the operating portions 422 to urge the pressing member 42 move outwards. The grooves 424 disengage with the posts 414 and the abutting portions 423 escape from the retention plates 52, whereby the heat sink 50 can be easily dissembled from the CPU 70.

As can be seen from the above description, the assembly and disassembly is easy and quick and needs no special tool. Meanwhile, since the supporting faces 411 and the side supporting faces 415 are designed to be coplanar with the top face of the CPU 70, the retention force by the pressing member 42 is partly supported by these faces 411, 415, not wholly to the CPU, thereby avoiding a damage of electrical connection between the CPU 70 and the printed circuit board on which socket 60 with the CPU 70 is mounted.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A retention device for mounting a heat sink to a CPU socket, comprising:
   a pair of supporting members mountable to a printed circuit board on opposite ends of a CPU socket, each supporting member defining a supporting portion and a pair of side portions at lateral sides of the supporting portion for enclosing around the opposite ends of the CPU socket, each supporting portion defining a supporting face for supporting a retention plate of a heat sink and a post on the supporting face, the post being adapted to insert through an aperture defined in the associated retention plate of the heat sink; and
   a pair of pressing members each pivotably assembled to a corresponding supporting member, each pressing member comprising a pressing portion and an operating portion, each pressing portion defining an abutting portion for engaging with an associated retention plate of the heat sink and a groove to securely engage with the post of a corresponding supporting member.

2. The retention device as claimed in claim 1, wherein the pair of side portions each have a side supporting face coplanar with the supporting face for supporting a corresponding side of the heat sink adjacent to an associated retention plate.

3. The retention device as claimed in claim 1, wherein each groove includes a neck section to firmly retain the post of a corresponding supporting member.

4. The retention device as claimed in claim 1, wherein the abutting portion of each pressing portion has a rough surface.

5. The retention device as claimed in claim 1, wherein the side portions of each supporting member have a respective through hole and wherein the pressing members have a respective axle extending through said through hole.

6. A combination comprising:
   a CPU socket;
   a pair of supporting members straddling two opposite sides of the socket, each said supporting members defining a supporting face;
   a pair of pressing members pivotably assembled to the corresponding pair of supporting members, respectively, each of said pressing members defining an abutting portion;
   a heat sink defining a pair of retention plates on two sides thereof, a corresponding retention plate being sandwiched between a corresponding supporting face of each said supporting member and a corresponding abutting portion of each said pressing member,
   first means for aligning the heat sink with regard to the supporting members and preventing lateral movement of the heat sink with regard to the supporting members; and
   second means for locking a corresponding pressing member to a corresponding supporting member; wherein
   said pressing members are rotated to an open position for allowing loading/unloading of the heat sink in a vertical direction, and to a locked position for cooperating with the supporting faces of the supporting members to latchably sandwich the retention plates of the heat sink therebetween.

7. The combination as claimed in claim 6, wherein said first means includes a post extending from each said supporting face, and a hole formed in each said retention plate.

8. The combination as claimed in claim 6, wherein said second means includes a groove with a neck formed in each said pressing member that receives a corresponding post extending from a corresponding supporting face of a corresponding supporting member.

* * * * *